United States Patent
Wong et al.

(10) Patent No.: US 10,332,834 B2
(45) Date of Patent: Jun. 25, 2019

(54) SEMICONDUCTOR FUSES WITH NANOWIRE FUSE LINKS AND FABRICATION METHODS THEREOF

(71) Applicant: GLOBALFOUNDRIES Inc., Grand Cayman (KY)

(72) Inventors: Chun Yu Wong, Ballston Lake, NY (US); Jagar Singh, Clifton Park, NY (US); Ashish Baraskar, Milpitas, CA (US); Min-hwa Chi, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 39 days.

(21) Appl. No.: 15/421,698

(22) Filed: Feb. 1, 2017

(65) Prior Publication Data
US 2017/0141031 A1    May 18, 2017

Related U.S. Application Data

(62) Division of application No. 14/865,589, filed on Sep. 25, 2015, now Pat. No. 9,601,428.
(Continued)

(51) Int. Cl.
*H01L 29/06* (2006.01)
*H01L 23/525* (2006.01)
(Continued)

(52) U.S. Cl.
CPC ...... *H01L 23/5256* (2013.01); *H01L 21/0226* (2013.01); *H01L 21/283* (2013.01);
(Continued)

(58) Field of Classification Search
CPC .................................................. H01L 29/0673
See application file for complete search history.

(56) References Cited

U.S. PATENT DOCUMENTS

| 5,417,180 A | 5/1995 | Nakamura |
| 8,816,327 B2 | 8/2014 | Chang et al. |

(Continued)

OTHER PUBLICATIONS

"Electrically Programmable Fuse (eFUSE) Using Electromigration in Silicides", IEEE EDL, vol. 23 No. 9, pp. 523-525, 2002, C. Kothandaraman, et al.
(Continued)

*Primary Examiner* — Peniel M Gumedzoe
*Assistant Examiner* — Christopher A Johnson
(74) *Attorney, Agent, or Firm* — Thompson Hine LLP; Francois Pagette

(57) ABSTRACT

Semiconductor fuses with nanowire fuse links and fabrication methods thereof are presented. The methods include, for instance: fabricating a semiconductor fuse, the semiconductor fuse including at least one nanowire fuse link, and the fabricating including: forming at least one nanowire, the at least one nanowire including a semiconductor material; and reacting the at least one nanowire with a metal to form the at least one nanowire fuse link of the semiconductor fuse, the at least one nanowire fuse link including a semiconductor-metal alloy. In another aspect, a structure is presented. The structure includes: a semiconductor fuse, the semiconductor fuse including: at least one nanowire fuse link, the at least one nanowire fuse link including a semiconductor-metal alloy.

5 Claims, 9 Drawing Sheets

Related U.S. Application Data

(60) Provisional application No. 62/137,865, filed on Mar. 25, 2015.

(51) Int. Cl.
*H01L 29/66* (2006.01)
*H01L 29/78* (2006.01)
*H01L 21/02* (2006.01)
*H01L 21/3205* (2006.01)
*H01L 21/283* (2006.01)
*H01L 27/112* (2006.01)

(52) U.S. Cl.
CPC ...... *H01L 21/3205* (2013.01); *H01L 29/0673* (2013.01); *H01L 29/66795* (2013.01); *H01L 29/785* (2013.01); *H01L 21/02532* (2013.01); *H01L 21/02639* (2013.01); *H01L 27/11206* (2013.01)

(56) References Cited

U.S. PATENT DOCUMENTS

| | | | | |
|---|---|---|---|---|
| 2013/0106496 A1* | 5/2013 | Chang | ................ | H01L 23/5256 327/525 |
| 2015/0279846 A1* | 10/2015 | Hwu | ................ | H01L 27/11206 257/379 |
| 2016/0086886 A1* | 3/2016 | Cheng | ............... | H01L 29/78696 257/347 |
| 2016/0118249 A1* | 4/2016 | Sreenivasan | ...... | H01L 21/02381 438/699 |

OTHER PUBLICATIONS

"eFuse Design and Reliability", IEEE International Integrated Reliability Workshop, 2008, W.R. Tonti.

* cited by examiner

SEMICONDUCTOR FUSES WITH NANOWIRE FUSE LINKS AND FABRICATION METHODS THEREOF

CROSS-REFERENCE TO RELATED APPLICATION

This application is a divisional of U.S. application Ser. No. 14/865,589 filed Sep. 25, 2015, claiming priority to U.S. Provisional Application No. 62/137,865 filed Mar. 25, 2015, which is hereby incorporated herein by reference in its entirety.

FIELD OF THE INVENTION

The present invention relates to semiconductor devices and fabricating semiconductor devices, and more particularly to semiconductor fuses with nanowire fuse links and fabrication methods thereof.

BACKGROUND OF THE INVENTION

Semiconductor fuse technology, sometimes called "e-fuse" technology, allows for post-fabrication hardware programming of integrated circuits. By analogy with a standard household fuse, a semiconductor fuse can be designed to permanently open circuit upon application of a programming current. By including numerous semiconductor fuses in an integrated circuit, on-chip modifications, one time programmable (OTP) memory, and/or circuit tuning functions can be provided. For example, using appropriate sensing circuits, a semiconductor fuse can represent a binary "1" when close circuited, and a binary "0" when open circuited.

As consumer demand continues to drive increased density and reduced critical dimensions of integrated circuits, fabrication processes may be modified to accommodate reduced critical dimensions. For instance, polycrystalline silicon transistor gates can be replaced with metal gates. In addition, transistors can be formed on three-dimensional fin structures to improve performance. Therefore, a need exists for semiconductor fuse technology that is compatible with processes used to fabricate high density integrated circuits.

BRIEF SUMMARY

The shortcomings of the prior art are overcome, and additional advantages are provided, through the provision, in one aspect, of a method. The method includes: fabricating a semiconductor fuse, the semiconductor fuse including at least one nanowire fuse link, and the fabricating including: forming at least one nanowire, the at least one nanowire including a semiconductor material; and reacting the at least one nanowire with a metal to form the at least one nanowire fuse link of the semiconductor fuse, the at least one nanowire fuse link including a semiconductor-metal alloy.

In another aspect, a structure is presented. The structure includes: a semiconductor fuse, the semiconductor fuse including: at least one nanowire fuse link, the at least one nanowire fuse link including a semiconductor-metal alloy.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
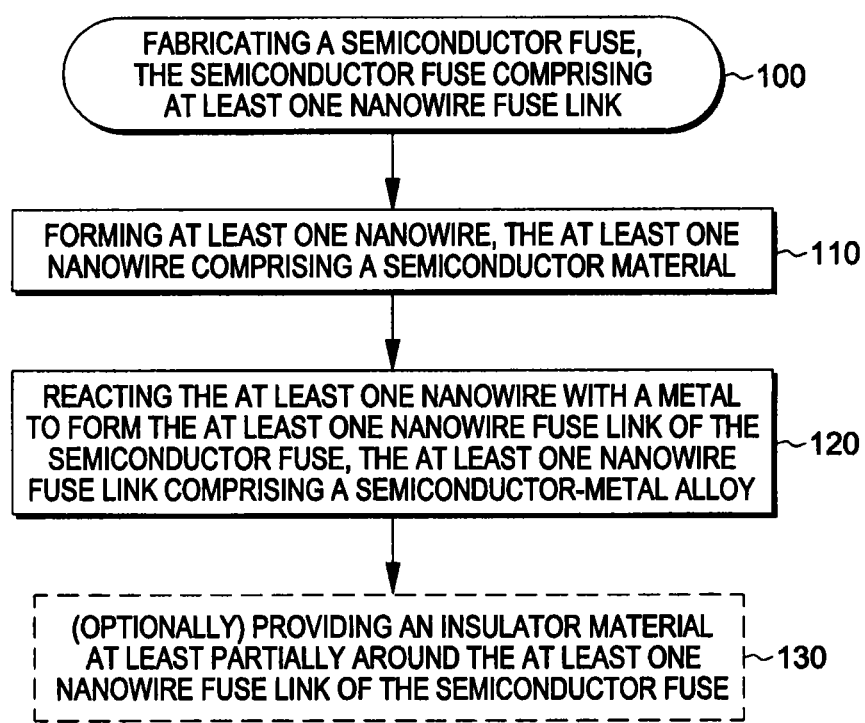
FIG. 1 depicts embodiments of processes for fabricating a semiconductor fuse, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, semiconductor fuses with nanowire fuse links and fabrication methods thereof. Because consumer demand continues to drive reduced critical dimensions of transistors, such as field-effect transistors, compatible semiconductor fuses also having such critical dimensions are desired. However, some process techniques that enable reduction of critical dimensions of semiconductor devices, such as transistors, can have an undesirable impact on semiconductor fuse fabrication processing.

For instance, in advanced semiconductor fabrication nodes, such as nodes having critical dimensions of 20 nanometer (nm) or below, polycrystalline silicon may be used as a sacrificial gate material that is removed and replaced with a final metal transistor gate. Thus, semiconductor fuse fabrication processes that rely on polycrystalline silicon (polysilicon) gates, such as silicided polysilicon semiconductor fuses formed within such polysilicon gates, will require additional mask steps to form polycrystalline silicon, increasing production costs and potentially reducing device yield.

In addition, advanced semiconductor fabrication nodes include three-dimensional transistor structures. In one example, fin-type metal-oxide-semiconductor field-effect transistors (fin FETs) make use of three dimensional fin structures, which extend from a semiconductor substrate. Fin structures are used to form a body of a fin FET, enabling greater on-current and reducing leakage current. In another example, nanowire technology can be used to form fully depleted transistors in which channel regions include the nanowires, and gate structures wrap all around the nanowires, enabling better gate control of such devices. Further, metal based fuses formed in the back-end-of-line (BEOL) or middle of line (MOL) stages of integrated circuit can require extremely large programming currents.

Advantageously, the present disclosure provides semiconductor fuses and related fabrication methods that are compatible with advanced semiconductor fabrication techniques, such as three dimensional semiconductor fabrication technologies, including fin structures and nanowires, and can be formed during front end of line (FEOL) processing.

Generally stated, provided herein, in one aspect, is a structure. The structure includes: a semiconductor fuse, the semiconductor fuse including: at least one nanowire fuse link, the at least one nanowire fuse link including a semiconductor-metal alloy.

In one embodiment, the structure further includes a fin structure extending above a substrate structure, wherein an upper portion of the fin structure comprises the at least one nanowire fuse link of the semiconductor fuse.

In another embodiment, the structure further includes an insulator material, the insulator material being disposed at least partially around the at least one nanowire fuse link of the semiconductor fuse.

In a further embodiment, the semiconductor-metal alloy of the at least one nanowire fuse link facilitates electromigration thereof upon application of a programming current through the semiconductor fuse.

In one example, the semiconductor fuse further comprises: an anode region and a cathode region electrically linked by the at least one nanowire fuse link, wherein the at least one nanowire fuse link facilitates open circuiting the semiconductor fuse upon application of a programming current between the anode region and the cathode region thereof.

In another example, the at least one nanowire fuse link of the semiconductor fuse has a diamond shaped cross-section.

Reference is made below to the drawings, which are not drawn to scale for ease of understanding, wherein the same reference numbers used throughout different figures designate the same or similar components.

FIG. 1 depicts embodiments of processes for fabricating a semiconductor fuse, in accordance with one or more aspects of the present invention. For instance, a method includes fabricating a semiconductor fuse, the semiconductor fuse including at least one nanowire fuse link 100. In such a case, the fabricating includes: forming at least one nanowire, the at least one nanowire comprising a semiconductor material 110; and reacting the at least one nanowire with a metal to form the at least one nanowire fuse link of the semiconductor fuse, the at least one nanowire fuse link comprising a semiconductor-metal alloy 120. In one example, the method further includes providing an insulator material at least partially around the at least one nanowire fuse link of the semiconductor fuse 130.

In one embodiment, the forming 110 includes: forming a fin structure extending above a substrate structure; and forming the at least one nanowire within an upper portion of the fin structure. For example, the forming can include growing, epitaxially, the upper portion of the at least one fin structure. In one example, the forming can include oxidizing the upper portion of the at least one fin structure to form the at least one nanowire therein. In another example, the forming can include separating the upper portion of the at least one fin structure from the substrate structure to form the at least one nanowire. In a further example, the method can further include oxidizing the upper portion of the at least one fin structure to form an insulator material at least partially around the at least one nanowire.

In another embodiment, the reacting 120 includes: providing the metal at least partially over the at least one nanowire; and annealing the metal and the at least one nanowire to form the semiconductor metal alloy of the at least one nanowire fuse link. In a further embodiment, the semiconductor-metal alloy of the at least one nanowire fuse link facilitates electromigration thereof upon application of a programming current through the semiconductor fuse.

In one implementation, the method further includes isolating, electrically, the at least one nanowire fuse link of the semiconductor fuse. In another implementation, the fabricating 100 further includes fabricating an anode region and a cathode region of the semiconductor fuse, wherein the anode region and the cathode region are electrically linked by the at least one nanowire fuse link. In such a case, for example, the at least one nanowire fuse link can facilitate open circuiting the semiconductor fuse upon application of a programming current between the anode region and the cathode region thereof.

In another implementation, the fabricating comprises forming the at least one nanowire fuse link of the semiconductor fuse with a diamond shaped cross-section. In a further implementation, the fabricating comprises forming the at least one nanowire fuse link of the semiconductor fuse with a circular cross-section.

Figure 2A:
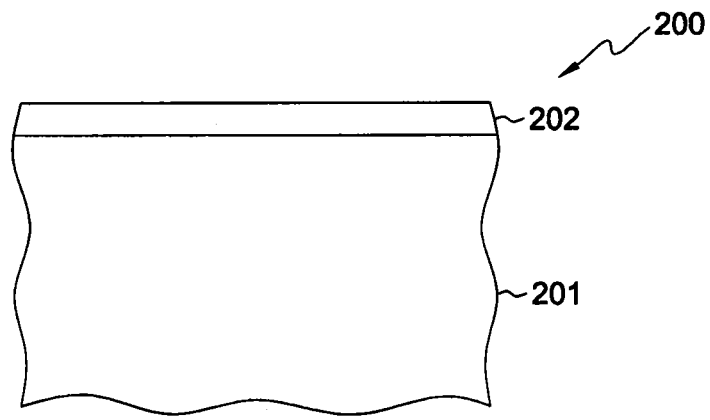
FIG. 2A is a cross-sectional elevational view of a structure found in semiconductor fuse fabrication, in accordance with one or more aspects of the present invention.

FIG. 2A is a cross-sectional elevational view of a structure 200 found in semiconductor fuse fabrication, in accordance with one or more aspects of the present invention. In the illustrated embodiment, structure 200 includes a substrate structure 201.

By way of explanation, structure 200 can include an entire wafer used in the fabrication of integrated circuits which can include thousands, millions, billions, or more semiconductor devices, such as transistors. Subsequent to fabrication processing, structure 200 can be diced into individual dies or integrated circuits (i.e., chips), and packaged for use in electronic devices. The techniques described herein can be applied across an entire wafer or portion thereof.

In one embodiment, a hard mask 202 can be provided over substrate structure 201, for use in photolithographic patterning and etching. For example, hard mask 202 can be or include silicon nitride, and may be deposited using any suitable deposition process, such as chemical vapor deposition (CVD).

In one embodiment, substrate structure 201 can be a bulk semiconductor material such as a bulk silicon wafer. In another embodiment, substrate structure 201 can include silicon (Si), single crystal Si, polycrystalline Si, amorphous Si, Si-on-nothing (SON), Si-on-insulator (SOI), or Si-on-replacement insulator (SRI). In a further embodiment, substrate structure 201 can be n-type or p-type doped. In one particular example, substrate structure 201 can have a thickness of approximately 600-900 micrometers.

Figure 2B:
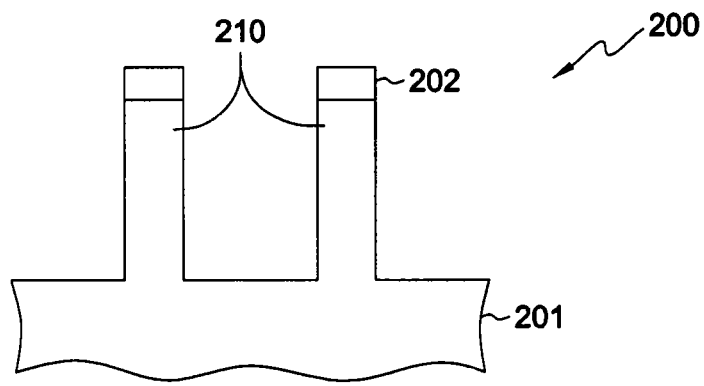
FIG. 2B depicts the structure of FIG. 2A after forming a fin structure(s) extending above a substrate structure thereof, in accordance with one or more aspects of the present invention.

FIG. 2B depicts structure 200 after forming a fin structure(s) 210 extending above substrate structure 201, in accordance with one or more aspects of the present invention. In one embodiment, hard mask 202 may be patterned to form fin structure(s) 210 using one or more techniques, such as: direct lithography; sidewall image transfer technique; extreme ultraviolet lithography (EUV); e-beam technique; litho-etch litho-etch; or litho-etch litho-freeze. In such a case, following patterning, removal of material of substrate structure 201 can be achieved using any suitable etching process, for example, anisotropic dry etching or reactive-ion-etching (RIE) in sulfur hexafluoride ($SF_6$). Although the following numbers are relative and the heights could vary, in one specific example, fin structure(s) 210 can have a height of about 40 to 300 nanometers and a length of about one micrometer, several micrometers, or the diameter of the entire wafer, and the width of fin structure(s) 210 can be approximately 1 to 20 nanometers.

In one embodiment, numerous fin structure(s) 210 may be formed over an entire wafer or an entire die of a wafer. In such an embodiment, fin structure(s) 210 may be formed at the smallest critical dimension during a single initial fin structure formation process, and some portions of the fin structures can removed during subsequent fabrication steps.

Figure 2C:
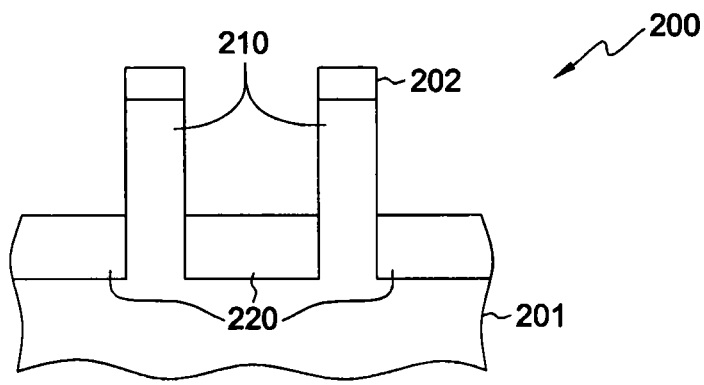
FIG. 2C depicts the structure of FIG. 2B after providing an isolation material over the substrate structure thereof, in accordance with one or more aspects of the present invention.

FIG. 2C depicts structure 200 after providing an isolation material 220 over substrate structure 201, in accordance with one or more aspects of the present invention. For example, isolation material 220 can be an oxide (e.g., silicon dioxide) or other material capable of electrically isolating portions of fin structures 210. In one embodiment, isolation material 220 can be deposited over structure 200 and recessed so that upper surfaces of isolation material 220 have a uniform height. For example, isolation material 220 can be an amorphous material.

Figure 2D:
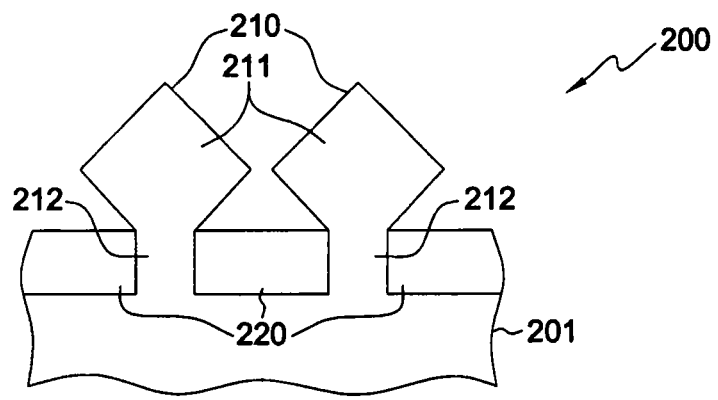
FIG. 2D depicts the structure of FIG. 2C after growing, epitaxially, an upper portion(s) of the fin structure(s) thereof, in accordance with one or more aspects of the present invention.

FIG. 2D depicts the structure of FIG. 2C after growing, epitaxially, upper portion(s) 211 of fin structure(s) 210 thereof, in accordance with one or more aspects of the present invention.

Epitaxial formation or growth refers to the orderly growth of a crystalline material on a crystalline substrate, where the grown material arranges itself in the same crystal orientation as the underlying substrate. In one example, epitaxial growth occurs from either one or more surfaces of fin structure 210, including, for example, a {111} plane, a {110} plane, and a {100} plane. The symbol {xyz} denotes the Miller index for the set of equivalent crystal planes.

For example, material, such as silicon, germanium, or alloys thereof, may be epitaxially formed or grown using selective epitaxial growth via various methods, such as, for example, vapor-phase epitaxy (VPE), a modification of chemical vapor deposition (CVD), molecular-beam epitaxy (MBE), and/or liquid-phase epitaxy (LPE), or other applicable methods.

In one embodiment, epitaxially forming, or growing, is confined to upper portion 211 of fin structure 210 because of the height of isolation material 220, because epitaxial growth occurs on a crystalline material, such as fin structure 211, and not amorphous or non-crystalline materials such as isolation material 220. For instance, upper portion 211 can serve as a seed for crystal growth, allowing for orderly growth or expansion of upper portion 211, to desired dimensions. In addition, upper portion 211 can have a diamond shaped cross section, e.g., having multiple {111} planes.

Figure 2E:
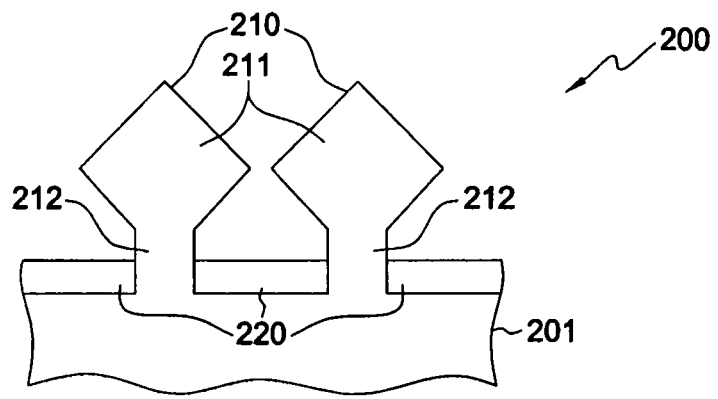
FIG. 2E depicts the structure of FIG. 2 after recessing the isolation material thereof, in accordance with one or more aspects of the present invention.

FIG. 2E depicts structure 200 after recessing isolation material 220, in accordance with one or more aspects of the present invention. For instance, isolation material 220 can be recessed by approximately 2-5 nm. In addition, isolation material 220 can be recessed using any suitable etching process. Further, isolation material 220 can be recessed by a specific amount as required by the design of the semiconductor fuse, in order to determine the distance between the nanowire fuse link to be formed and the substrate structure, because the recessing process will expose more of the upper portions to subsequent processing steps.

Figure 2F:
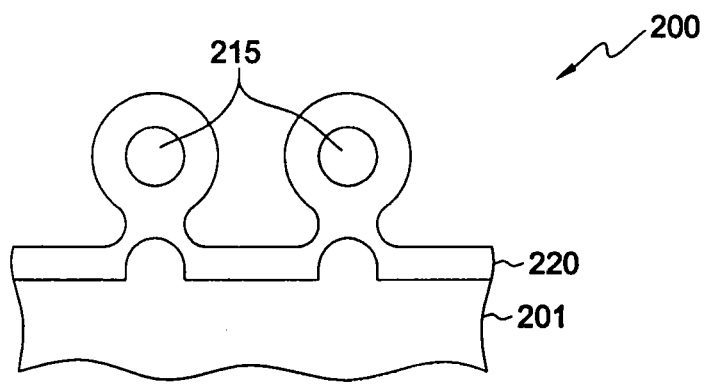
FIG. 2F depicts the structure of FIG. 2E after forming a nanowire(s) by oxidizing the upper portion(s) of the fin structure(s) thereof, in accordance with one or more aspects of the present invention.

FIG. 2F depicts structure 200 after forming nanowire(s) 215 by oxidizing upper portion(s) 211 of the structure(s) thereof, in accordance with one or more aspects of the present invention. In one example, oxidizing can include annealing upper portions 211 (e.g., in an oxygen environment) so that semiconductor material of upper portions 211 around nanowires 215 forms an insulator material, such as a semiconductor oxide, around nanowires 215 which are not oxidized. In another example, oxidizing can include annealing in the presence of an oxygen rich atmosphere or oxygen plasma.

In one embodiment, after oxidizing upper portions 211 to form nanowires 215, an insulator material remains below nanowires 215, providing structural stability for nanowires 215 during fabrication processing. For instance, an oxide material, such as silicon dioxide, can support nanowires 215 from below. In addition, nanowires 215 can be between approximately 1-5 nm in diameter. Further, the size of nanowires can be tuned by the various process parameters of the oxidation processing, including one or more of the following parameters: length of time, temperature, percentage of oxygen in the atmosphere, density (e.g., of an oxygen plasma) and presence of various process gases (e.g., $N_2$ or $F_2$) of different concentrations (e.g., <50% in volume). For example, the oxidation rate of the nanowire can be gradually decreased as the size of nanowire decreases, so that the diameter of nanowire is more uniform.

Figure 2G:
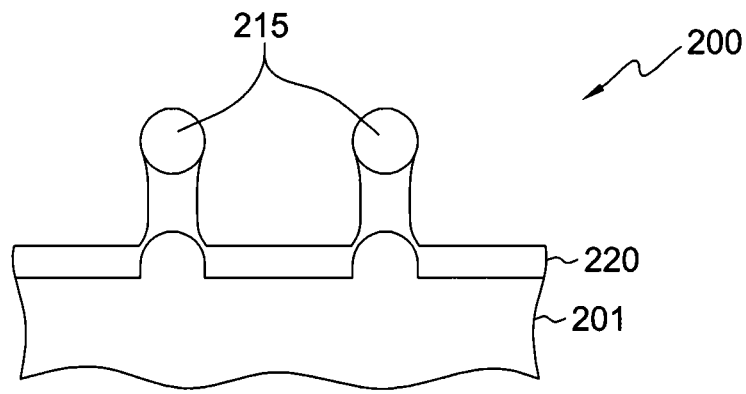
FIG. 2G depicts the structure of FIG. 2F after exposing the nanowire(s) thereof, in accordance with one or more aspects of the present invention.

FIG. 2G depicts structure 200 after exposing nanowire(s) 215, in accordance with one or more aspects of the present invention. In one embodiment, structure 200 can be selectively etched with a directional etchant that selectively removes the isolation material without removing the nanowire material. For example, an anisotropic plasma etching can be used to preserve isolation material 220 beneath nanowires 215 to retain structural stability of nanowires 215 during subsequent fabrication processing. In such a case, the etching will not remove material beneath nanowires 215.

Figure 2H:
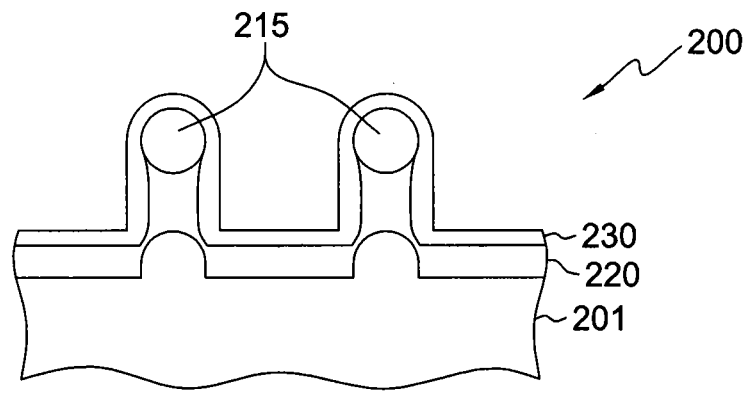
FIG. 2H depicts the structure of FIG. 2G after providing a metal at least partially over the nanowire(s) thereof, in accordance with one or more aspects of the present invention.

FIG. 2H depicts structure 200 after providing a metal 230 at least partially over nanowire(s) 215, in accordance with one or more aspects of the present invention. For example, metal 230 can be nickel, cobalt, magnesium, platinum, titanium, tungsten, or any combination/alloy thereof, or any other electropositive material.

Figure 2I:
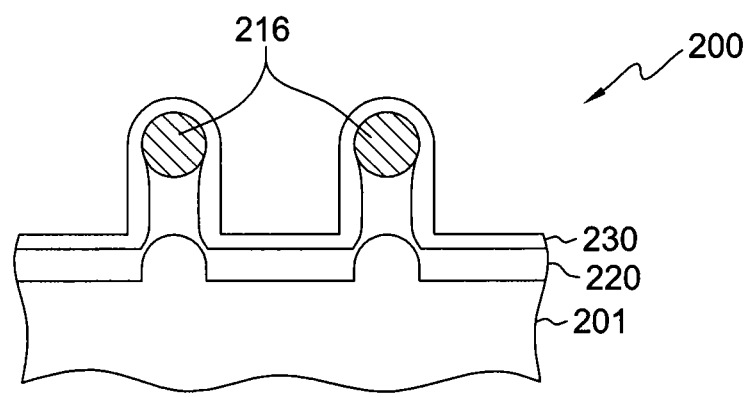
FIG. 2I depicts the structure of FIG. 2H after reacting the nanowire(s) with the metal to form a nanowire fuse link(s), in accordance with one or more aspects of the present invention.

FIG. 2I depicts structure 200 after reacting nanowire(s) 215 (see FIG. 2H) with metal 230 to form a nanowire fuse link(s) 216, in accordance with one or more aspects of the present invention. For instance, the reacting can be achieved by annealing metal 230 and nanowires 215 (see FIG. 2H) to form a semiconductor metal alloy (e.g., metal silicide) as nanowire fuse links 216. In addition, depending upon the metal and the semiconductor, the full reacting of nanowires 215 can be tuned by adjusting the temperature (e.g., between 350-700° C.) and time of the annealing (e.g., between 1-60 minutes) to account for differences in diffusion constants and other material properties of the metal and semiconductor. In another embodiment, after reacting, nanowire fuse links 216 can have a less circular shape and can be larger in size (e.g., 30-50% larger) than nanowires 215 (see FIG. 2H) prior to reacting with the metal.

In one embodiment, if the nanowires include silicon, after reacting the nanowire fuse links will include a semiconductor-metal alloy such as a silicide, e.g., nickel silicide, cobalt silicide, titanium silicide.

In another embodiment, the semiconductor-metal alloy of the at least one nanowire fuse link facilitates electromigration thereof upon application of a programming current through the semiconductor fuse.

By way of explanation, electromigration is the transport of material caused by momentum exchange between electrons and atoms. For example, when a programming current is applied through a semiconductor fuse having a nanowire fuse link, the greatest current density will be in the portion of the semiconductor fuse with the smallest minimum dimension, such as the nanowire fuse link thereof. In addition, a narrow region of the semiconductor fuse, such as the nanowire fuse link portion having a semiconductor-metal alloy, offers a higher resistance (e.g., than a pure metal fuse) to the carrier flow. In such a case, the nanowire fuse link will have the highest temperature of the semiconductor fuse, with the heat generation proportional to $I^2 \times r$, where I is the current and r is the resistance. When a sufficient programming current is applied for a sufficient period of time at a sufficient temperature (e.g., 150-250° C.), electromigration of material of nanowire fuse link can occur. In addition, atoms of conductive material of the nanowire fuse link will be transported by electromigration, leading to open circuiting or breaking the nanowire fuse link. In an electromigration induced open circuit, in the open state, the semiconductor fuse offers significantly higher resistance, for example 10,000 times greater, as compared to the closed circuit state. Advantageously, nanowire fuse link 216 has a narrow minimum dimension, making it an ideal choice as an electromigration point, thereby controlling the electro-migration location of the semiconductor fuse.

Figure 2J:
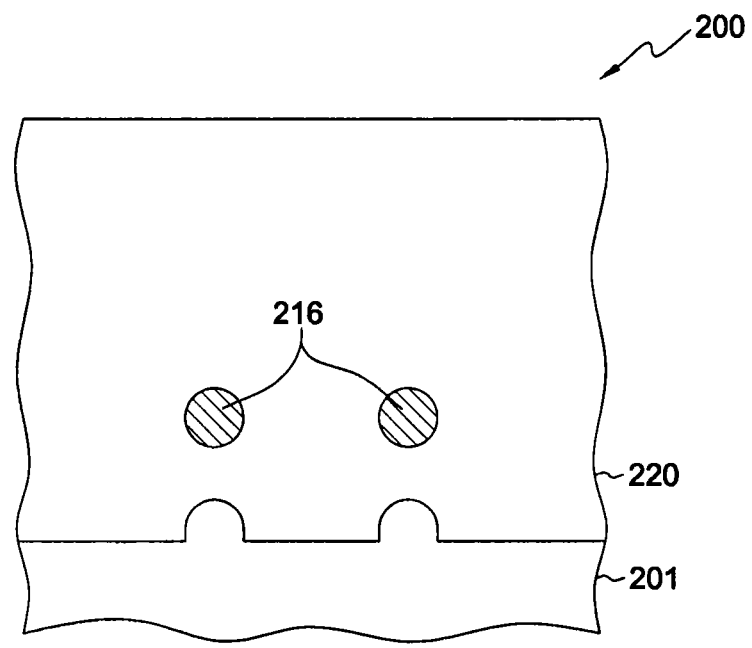
FIG. 2J depicts the structure of FIG. 2I after providing an insulator material at least partially around the nanowire fuse link(s) thereof, in accordance with one or more aspects of the present invention.

FIG. 2J depicts structure 200 after providing isolation (e.g., insulator) material 220 at least partially around nanowire fuse link(s) 216, in accordance with one or more aspects of the present invention. Isolation material 220, which can be, for example, an oxide such as silicon dioxide, can be deposited using any suitable deposition method, such as chemical vapor deposition (CVD).

In one embodiment, isolation material 220 electrically insulates nanowire fuse links 216 from nearby portions of structure 220. In another embodiment, isolation material 220 thermally insulates nanowire fuse links 216 from nearby portions of structure 220. In another embodiment, remaining, un-reacted portions of metal 230 (see FIG. 2I) can be selectively etched prior to providing isolation material 220.

In a further embodiment, isolation material 220 can include multiple different insulator or isolation materials. For example, the isolation material initially shown in FIG. 2C can be one material, the isolation material formed through oxidation of upper portions of fin structures as depicted in FIG. 2F can be another material, and the isolation material introduced as described in FIG. 2J can be a further material. For simplicity, the embodiment of FIG. 2J depicts a single uniform isolation material 220, which can be, for example, silicon dioxide, in an example where substrate structure 201 is a silicon substrate.

Figure 2K:
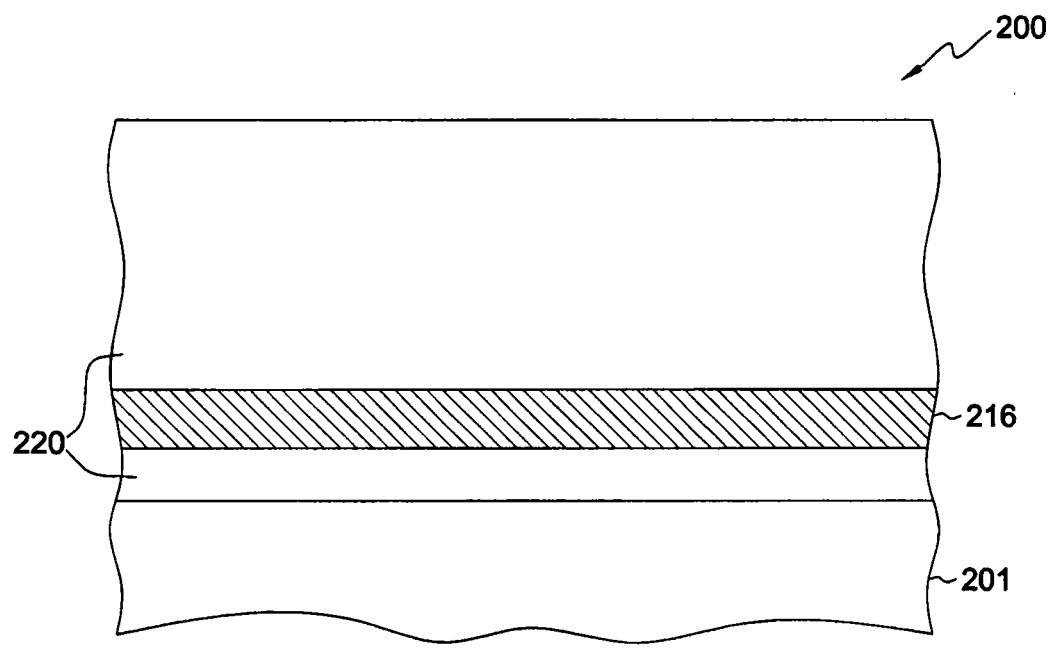
FIG. 2K is another cross-sectional elevational view of the structure of FIG. 2J, in accordance with one or more aspects of the present invention.

FIG. 2K is another cross-sectional elevational view of structure 200, in accordance with one or more aspects of the present invention. The view of FIG. 2K is taken perpendicular to the view of FIG. 2J, and runs along a single nanowire fuse link 216. In one embodiment, some of the fabrication processes described herein (see FIGS. 2D-2K) are applied selectively through the use of masking steps in certain regions of structure 200. In such a case, after formation of semiconductor fuses as described herein, subsequent processing steps may be employed to form numerous fin-type field-effect transistors, including revealing fin structures, forming gates, sources, drains, etc.

Figure 2L:
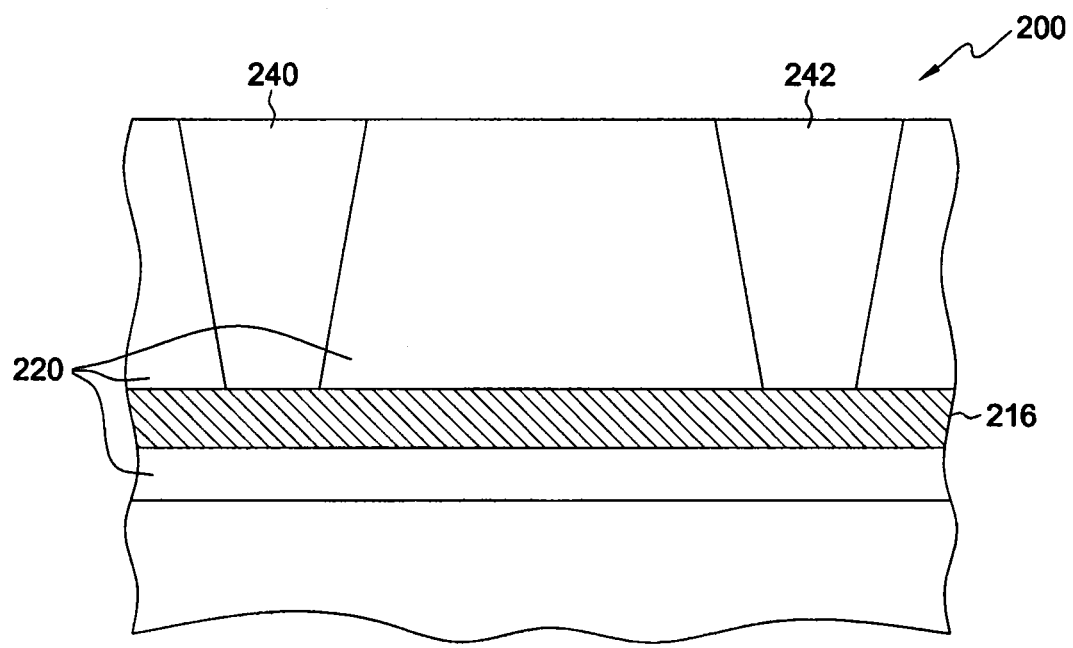
FIG. 2L depicts the structure of FIG. 2K after forming an anode region and a cathode region of the semiconductor fuse thereof, in accordance with one or more aspects of the present invention.

FIG. 2L depicts structure 200 after forming an anode region 240 and a cathode region 242 of a semiconductor fuse, in accordance with one or more aspects of the present invention. Anode region 240 and cathode region 242 can include a conductive material, e.g., a conductive contact of tungsten or aluminum. Advantageously, formation of anode region 240 and cathode region 242 can occur in a single process step with the formation of source/drain contacts for fin-type field-effect transistors disposed on structure 200.

In the illustrated embodiment, anode region 240 and cathode region 242 are electrically linked by nanowire fuse link 216. In another embodiment, anode region 240 and cathode region 242 can be electrically linked by multiple nanowire fuse links 216, depending on the amount of programming current desired to be necessary to open circuit the semiconductor fuse. For example, having 2 or 3 nanowire fuse links will proportionally divide an applied current, thereby increasing the programming current twofold or three-fold.

In another embodiment, nanowire fuse link 216 facilitates open circuiting the semiconductor fuse upon application of a programming current between anode region 240 and cathode region 242 of the semiconductor fuse.

FIGS. 3A-3H provide other embodiments of semiconductor fuses and fabrication processes thereof, in accordance with one or more aspects of the present invention. Advantageously, a diamond shaped nanowire fuse link can have a uniform size distribution, so that the programming current required can be more controllable and uniform in distribution (e.g., have less fabrication variation).

Figure 3A:
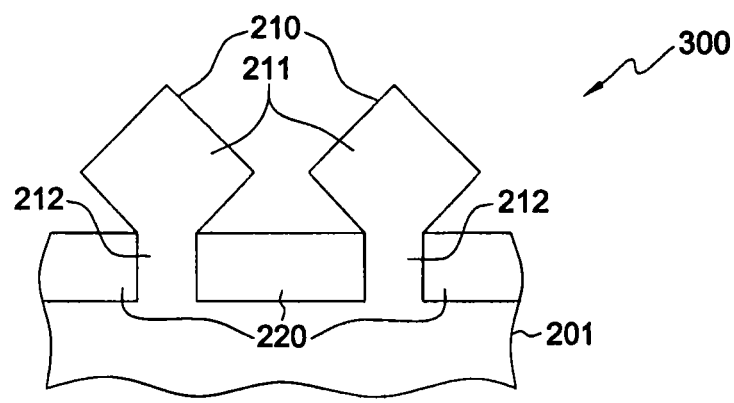
FIG. 3A is a cross-sectional elevational view of a structure found in semiconductor fuse fabrication, in accordance with one or more aspects of the present invention.
Figure 3B:
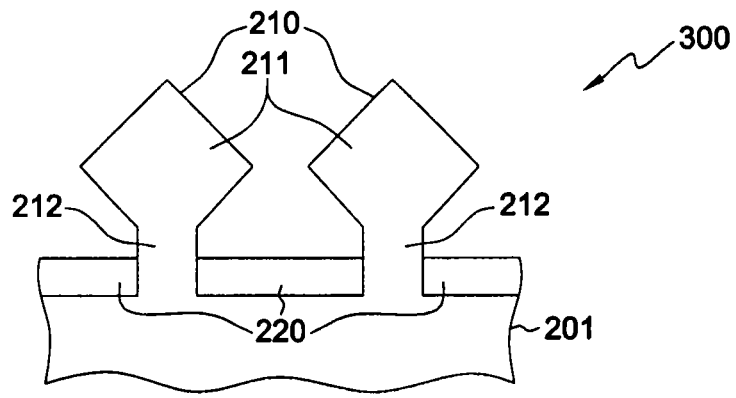
FIG. 3B depicts the structure of FIG. 3A after recessing the isolation material thereof, in accordance with one or more aspects of the present invention.

FIG. 3A is a cross-sectional elevational view of a structure 300 found in semiconductor fuse fabrication, and FIG. 3B depicts structure 300 after recessing isolation material 220, in accordance with one or more aspects of the present invention.

Figure 3C:
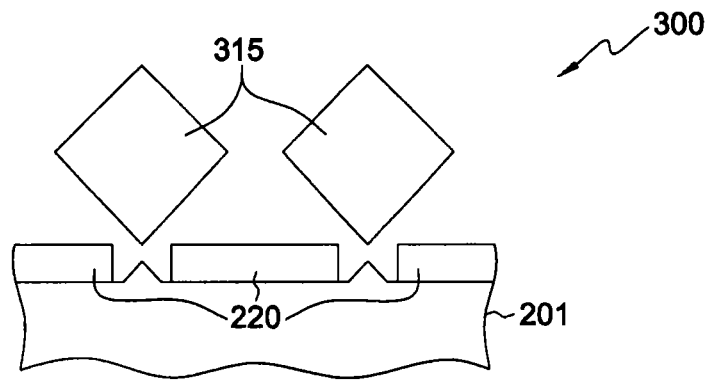
FIG. 3C depicts the structure of FIG. 3B after forming a nanowire(s) by separating upper portion(s) of fin structure(s) from a substrate structure thereof, in accordance with one or more aspects of the present invention.

FIG. 3C depicts structure 300 after forming nanowire(s) 315 by separating upper portion(s) 211 (see FIG. 3B) of fin structure(s) 210 (see FIG. 3B) from substrate structure 201, in accordance with one or more aspects of the present invention. In one example, diamond shaped nanowires 315 can be formed by using wet anisotropic etching to separate the diamond head of the fin structures from the substrate selectively (e.g., using masks to open fuse areas and protect other areas of structure 200). For example, etching can include tetramethylammonium hydroxide (TMAH) and/or potassium hydroxide (KOH). Other portions of structure 300, such as anode portions or cathode portions, which are not depicted in the cross-section of FIG. 3C, can support the nanowires during the separation process.

In another example, after the separating, an isolation material can be deposited in contact with lower portions of the diamond shaped nanowires 315 to prevent material introduced in subsequent processing steps, such as metals, from reaching portions of structure 300 beneath the diamond shaped nanowires 315.

Figure 3D:
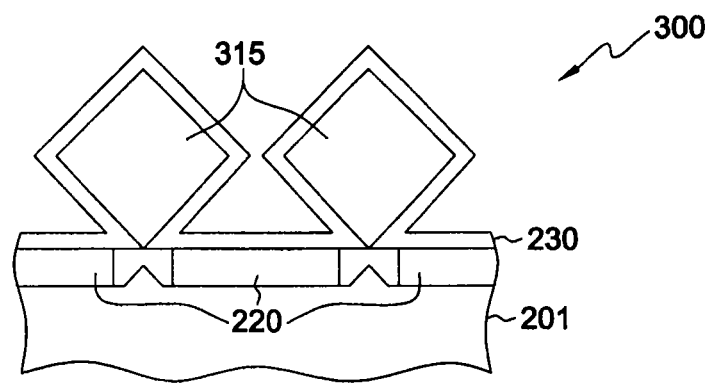
FIG. 3D depicts the structure of FIG. 3C after providing a metal at least partially over the nanowire(s) thereof, in accordance with one or more aspects of the present invention.
Figure 3E:
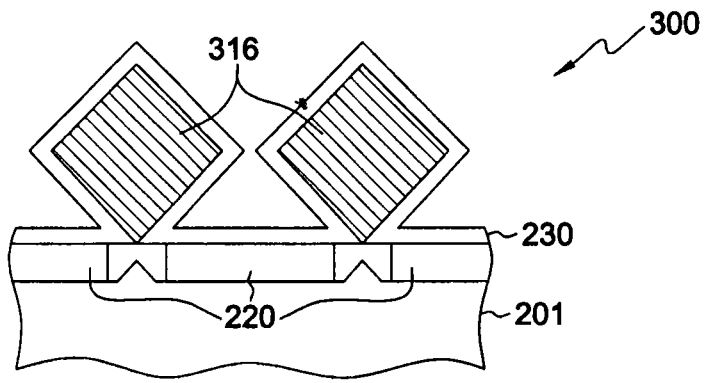
FIG. 3E depicts the structure of FIG. 3D after reacting the nanowire(s) with the metal to form a nanowire fuse link(s), in accordance with one or more aspects of the present invention.

FIG. 3D-3E depicts structure 300 after providing a metal 230 at least partially over nanowire(s) 315 (FIG. 3D) and reacting nanowire(s) 315 (FIG. 3D) with metal 230 to form nanowire fuse link(s) 316 (FIG. 3E), in accordance with one or more aspects of the present invention. By contrast with the embodiment of FIG. 2I, in the embodiment of FIG. 3E, nanowire fuse link 316 of a semiconductor fuse is formed with a diamond shaped cross-section. In one embodiment, nanowire fuse link 316 can be larger in size and less regularly diamond shaped than nanowire(s) 315 (FIG. 3D). In another embodiment, in a replacement gate process, the fabrication steps described with respect to FIGS. 3A-3F can be employed after removal of sacrificial gate structures from various regions of structure 200. In such a case, semiconductor fuses can be formed and sealed in replacement gate trenches, and replacement gates (e.g., replacement metal gate) can be selectively deposited on structure 200.

Figure 3F:
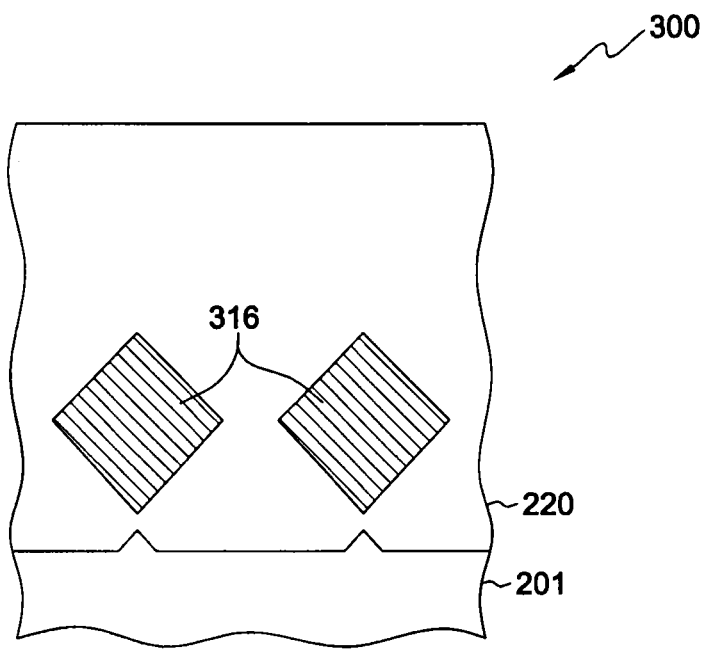
FIG. 3F depicts the structure of FIG. 3E after providing an insulator material at least partially around the nanowire fuse link(s) thereof, in accordance with one or more aspects of the present invention.

FIG. 3F depicts structure 300 after providing insulator material 220 at least partially around nanowire fuse link(s) 316, in accordance with one or more aspects of the present invention.

Figure 3G:
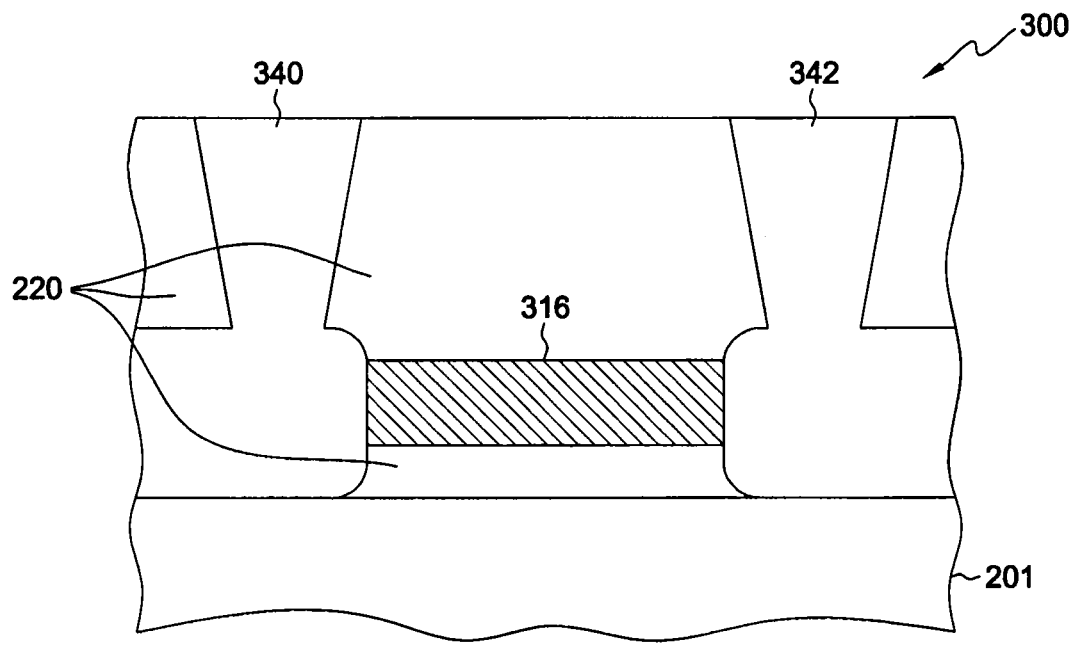
FIG. 3G is another cross-sectional elevational view of the structure of FIG. 3F after forming an anode region and a cathode region of the semiconductor fuse thereof, in accordance with one or more aspects of the present invention.
Figure 3H:
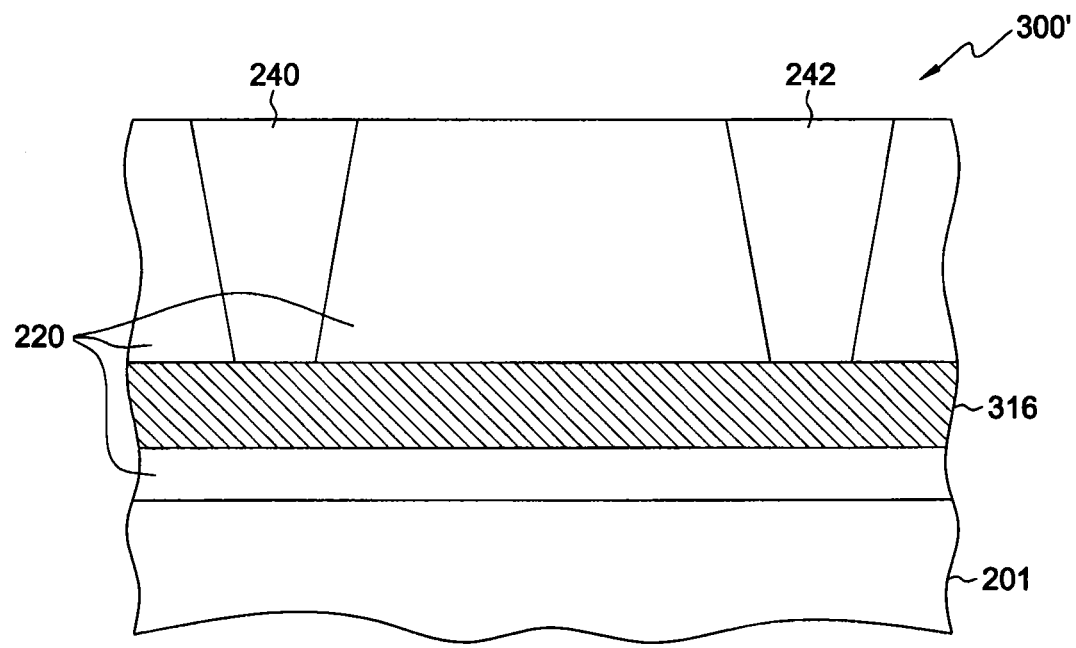
FIG. 3H is another cross-sectional elevational view of the structure of FIG. 3F after forming an anode region and a cathode region of the semiconductor fuse thereof, in accordance with one or more aspects of the present invention.

FIGS. 3G & 3H depict various configurations of semiconductor fuses, in accordance with one or more aspects of the present invention.

FIG. 3G is another cross-sectional elevational view of structure 300 after forming an anode region 340 and a cathode region 342 of a semiconductor fuse, in accordance with one or more aspects of the present invention. In the embodiment of FIG. 3G, the ends of nanowire fuse link 316 make contact with anode region 340 and cathode region 342. By contrast, in the embodiment of FIG. 3H structure 300' includes anode region 240 and cathode region 242 that make contact with top portions of nanowire fuse link 316.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A structure comprising:
   a semiconductor fuse, the semiconductor fuse comprising:
      at least one nanowire fuse link, the at least one nanowire fuse link comprising a semiconductor-metal alloy; and
      an insulator material, the insulator material being disposed completely around the at least one nanowire fuse link of the semiconductor fuse, surrounding entirely a portion of the nanowire fuse link extending between an anode region and a cathode region.

2. The structure of claim 1, further comprising:
   a fin structure extending above a substrate structure, wherein an upper portion of the fin structure comprises the at least one nanowire fuse link of the semiconductor fuse.

3. The structure of claim 1, wherein the semiconductor-metal alloy of the at least one nanowire fuse link facilitates electromigration thereof upon application of a programming current through the semiconductor fuse.

4. The structure of claim 1, wherein the semiconductor fuse further comprises:
   the anode region and the cathode region electrically linked by the at least one nanowire fuse link, wherein the at least one nanowire fuse link facilitates open circuiting the semiconductor fuse upon application of a programming current between the anode region and the cathode region thereof.

5. The structure of claim 1, wherein the at least one nanowire fuse link of the semiconductor fuse has a diamond shaped cross-section.

* * * * *